United States Patent
Li et al.

(10) Patent No.: US 12,182,372 B2
(45) Date of Patent: Dec. 31, 2024

(54) TOUCH DISPLAY PANEL

(71) Applicant: GUANGZHOU GOVISIONOX TECHNOLOGY CO., LTD., Guangdong (CN)

(72) Inventors: Mingsheng Li, Guangzhou (CN); Ming Xie, Guangzhou (CN); Hong Zheng, Guangzhou (CN)

(73) Assignee: GUANGZHOU GOVISIONOX TECHNOLOGY CO., LTD., Guangzhou (CN)

( * ) Notice: Subject to any disclaimer, the term of this patent is extended or adjusted under 35 U.S.C. 154(b) by 0 days.

(21) Appl. No.: 18/360,323

(22) Filed: Jul. 27, 2023

(65) Prior Publication Data

US 2023/0367438 A1  Nov. 16, 2023

Related U.S. Application Data (63) Continuation of application No. PCT/CN2022/108698, filed on Jul. 28, 2022.

(30) Foreign Application Priority Data

Nov. 12, 2021  (CN) .......................... 202111341121.9

(51) Int. Cl.
*G06F 3/041* (2006.01)
*G06F 3/044* (2006.01)
*H10K 59/40* (2023.01)

(52) U.S. Cl.
CPC .......... *G06F 3/0446* (2019.05); *G06F 3/0412* (2013.01); *G06F 3/0445* (2019.05);
(Continued)

(58) Field of Classification Search
CPC ..... G06F 3/0412; G06F 3/0416; G06F 3/0443
See application file for complete search history.

(56) References Cited

U.S. PATENT DOCUMENTS

2018/0095566 A1*  4/2018  Lee ..................... G06F 3/0412
2018/0095582 A1*  4/2018  Hwang ................ G06F 3/0412
(Continued)

FOREIGN PATENT DOCUMENTS

CN  103941447 A  7/2014
CN  103941934 A  7/2014
(Continued)

OTHER PUBLICATIONS

Chinese First Office Action, Chinese Application No. 202111341121. 9, mailed Jun. 29, 2023 (16 pages).
(Continued)

*Primary Examiner* — Kevin M Nguyen
(74) *Attorney, Agent, or Firm* — Maier & Maier, PLLC (57) ABSTRACT

A touch display panel includes a light-emitting display layer, first touch electrodes, a color resist layer, and second touch electrodes. The light-emitting display layer includes a plurality of light-emitting units arranged in an array; the first touch electrodes are located on the side of the light-emitting display layer facing a light-emitting surface of the touch display panel, and are arranged in a first direction parallel to the touch display panel; the color resist layer includes a plurality of color resist units arranged in an array; the color resist units are arranged right opposite to the light-emitting units, and the color resist layer and the first touch electrodes are arranged side by side; the second touch electrodes are located on the side of the light-emitting display layer facing the light-emitting surface of the touch display panel, and are arranged in a second direction parallel to the touch display panel.

20 Claims, 7 Drawing Sheets

(52) U.S. Cl.
CPC ........... *G06F 3/0448* (2019.05); *H10K 59/40* (2023.02); *G06F 2203/04102* (2013.01); *G06F 2203/04103* (2013.01); *G06F 2203/04111* (2013.01)

(56) References Cited

U.S. PATENT DOCUMENTS

| | | |
|---|---|---|
| 2021/0226175 A1 | 7/2021 | Cao et al. |
| 2022/0229514 A1* | 7/2022 | Park ...................... G06F 3/0443 |

FOREIGN PATENT DOCUMENTS

| | | |
|---|---|---|
| CN | 107275512 A | 10/2017 |
| CN | 109119453 A | 1/2019 |
| CN | 109407870 A | 3/2019 |
| CN | 106527794 B | 9/2019 |
| CN | 110989862 A | 4/2020 |
| CN | 111129082 A | 5/2020 |
| CN | 114201070 A | 3/2022 |

OTHER PUBLICATIONS

International Search Report, International Application No. PCT/CN2022/108698, mailed Oct. 27, 2022 (15 pages).

Third Office Action issued on May 27, 2024, in corresponding Chinese Application No. 202111341121.9, 20 pages.

* cited by examiner

TOUCH DISPLAY PANEL

CROSS REFERENCE TO RELATED APPLICATIONS

The present application is a continuation application of the international patent application No. PCT/CN2022/108698, filed on Jul. 28, 2022, which claims foreign priority of Chinese Patent Application No. 202111341121.9, filed on Nov. 12, 2021, in the title of "Touch Display Panel", the entire contents of which are hereby incorporated by reference in their entireties.

TECHNICAL FIELD

The present disclosure relates to the field of semiconductor elements, and in particular to a touch display panel.

BACKGROUND

As display technology develops rapidly, display panels having touch function, serving as information input tools, are widely applied in various display products, such as mobile phones and tablet computers. A flexible touch display panel is one of developing directions in the field of touch displays. Flexible touch display panels that are bendable, foldable and have a fixed curvature have a wide range of application markets. However, the bendable and foldable flexible touch display panels may have poor mechanical reliability, such that these touch display panels may not be produced in mass. The touch display panels may be excessively thick and may not be bent easily. Further, when the touch display panels are bent continuously for a large number of times, material of the touch display panels may be cracked, the touch display panels may be failed fast, and a functional layer of the touch display panel may be peeled off, affecting usage of the touch display panels.

SUMMARY

Therefore, the present disclosure provides a touch display panel, having a reduced thickness and improved bending performance.

The present disclosure provides a touch display panel, including: a light-emitting display layer, comprising a plurality of light-emitting units arranged in an array; a first touch electrode, disposed on a side of the light-emitting display layer facing a light emitting surface of the touch display panel, wherein the first touch electrode is arranged along a first direction parallel to the touch display panel; a colour resist layer, comprising a plurality of colour resist units arranged in an array, wherein the plurality of colour resist units are directly facing the plurality of light-emitting units, the colour resist layer and the first touch electrode are arranged side by side; and a second touch electrode, disposed on the side of the light-emitting display layer facing the light-emitting surface of the touch display panel, wherein the second touch electrode is arranged along a second direction parallel to the touch display panel, the first direction intersects with the second direction, and the second touch electrode is insulated from the first touch electrode at an overlap between the second touch electrode and the first touch electrode.

According to the touch display panel of the present disclosure, the color resist layer and the first touch electrode are arranged side by side with each other, such that the colour resist layer and the first touch electrode are disposed on the same layer, the thickness of the touch display panel is reduced. Therefore, the thickness of the touch display panel is smaller. When the touch display panel is a flexible display panel, the touch display panel may be bent or curved easily, such that the panel material of the touch display panel may not be cracked or peeled off from the touch display panel material. In addition, since the colour resistance layer and the first touch electrode are arranged side by side and are disposed on the same layer, the first touch electrode and the second touch electrode can support and fix the colour resist layer, such that stability of the colour resist layer is improved, and the touch performance of the touch display panel is not affected. Furthermore, the colour resist layer and the first touch electrode are arranged side by side, and therefore, the distance between the colour resist layer and the light-emitting display layer is smaller, and the distance that the light emitted from the light-emitting display layer is propagating to reach the colour resist layer is smaller. In this way, the colour resist effect of the colour resist layer is improved, and the light-emitting efficiency of the touch display panel is improved. Further, the medium between the colour resist layer and the light-emitting display layer is less, and the light-emitting effect of the light-emitting display layer is improved, such that the light-emitting efficiency of the touch display panel is increased.

DETAILED DESCRIPTION

Technical solutions of the embodiments of the present disclosure will be clearly and completely described below by referring to the accompanying drawings of the present disclosure.

Figure 1:
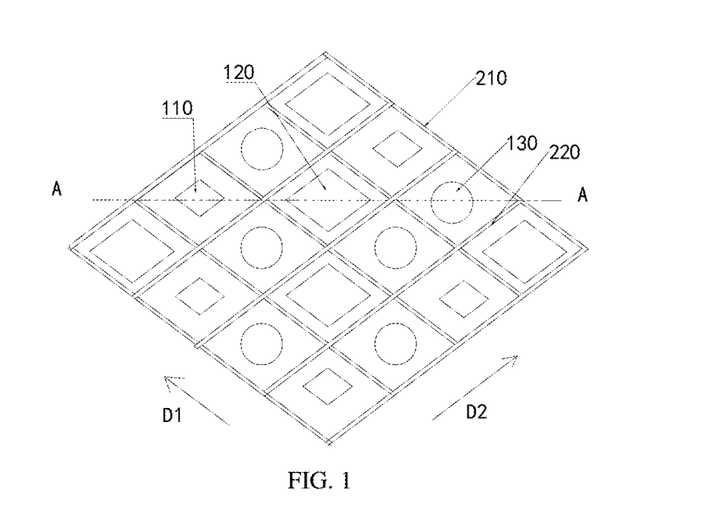
FIG. 1 is a planar structural schematic view of a touch display panel according to an embodiment of the present disclosure.
Figure 2:
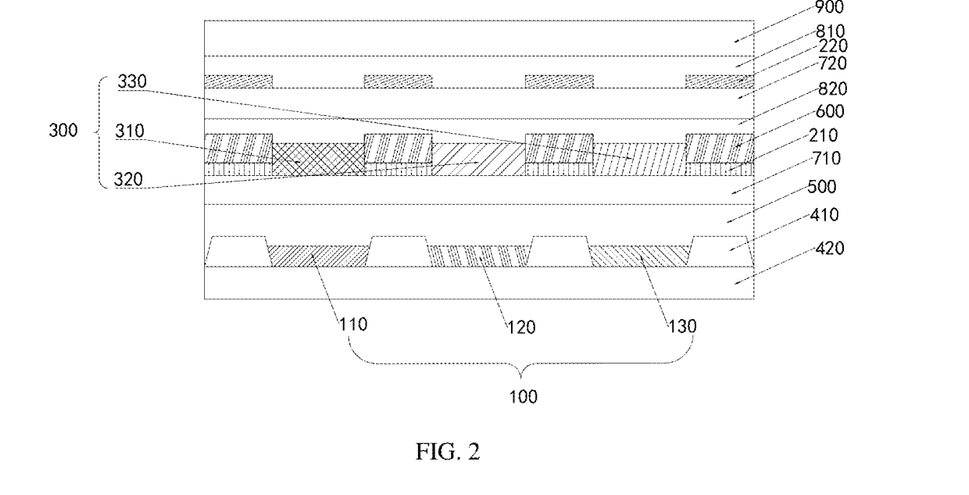
FIG. 2 is a cross-sectional schematic view of the structure shown in FIG. 1, taken along the line A-A.

The present embodiment provides a touch display panel, as shown in FIG. 1 and FIG. 2, including a light-emitting display layer 100, a first touch electrode 210, a color resist layer 300, and a second touch electrode 220. The light-emitting display layer 100 includes a plurality of light-emitting units arranged in an array (not shown). The first touch electrode 210 is disposed on a side of the light-emitting display layer 100 facing a light-emitting surface of the touch display panel. The first touch electrode 210 is arranged along a first direction D1 parallel to the touch display panel. The colour resist layer 300 includes a plurality of colour resist units arranged in an array (not shown). The colour resist units are arranged facing the light-emitting units. The colour resist layer 300 and the first touch electrode 210 are arranged side by side with each other. The second touch electrode 220 is located on the side of the light-emitting display layer 100 facing the light-emitting surface of the touch display panel. The second touch electrode 220 is arranged along a second direction parallel to the touch display panel. The first direction D1 intersects with the second direction D2. An overlap between the second touch electrode 220 and the first touch electrode 210 locates at an insulated position. For example, the overlap refers to a location where the extending direction of the second touch electrode 220 (such as the second direction D2) overlaps with the extending direction of the first touch electrode 210 (such as the first direction D1).

In the present embodiment, the colour resist layer 300 and the first touch electrode 210 are arranged side by side, such that the colour resist layer 300 and the first touch electrode 210 are disposed on a same layer, a thickness of the touch display panel is reduced, the thickness of the touch display panel is thinner. When the touch display panel is a flexible display panel, the touch display panel may be bent or folded easily, such that the material of the touch display panel may not be cracked or peeled off from the touch display panel. In addition, in the present application embodiment, the colour resist layer 300 and the first touch electrode 210 are arranged side by side and are disposed on the same layer, such that the first touch electrode 210 and the second touch electrode 220 may support and fix the colour resist layer 300, improving the stability of the colour resist layer 300 without affecting the touch performance of the touch display panel. Furthermore, in the present application embodiment, the colour resist layer 300 and the first touch electrode 210 are arranged side by side, such that the distance between the colour resist layer 300 and the light-emitting display layer 100 is smaller, and the distance that the light emitted from the light-emitting display layer 100 propagates to reach the colour resist layer 300 is smaller. In this way, the colour resist effect of the colour resist layer 300 is improved, and the light-emitting efficiency of the touch display panel is improved. Further, the medium between the colour resist layer 300 and the light-emitting display layer 100 is less, the light-emitting effect of the light-emitting display layer 100 is improved, and therefore, the light-emitting efficiency of the touch display panel is improved.

In the present embodiment, the light-emitting units include a first light-emitting unit 110, a second light-emitting unit 120, and a third light-emitting unit 130. The first light-emitting unit 110, the second light-emitting unit 120, and the third light-emitting unit 130 are configured to produce three different colours of primary light. For example, in the present embodiment, the first light-emitting unit 110 emits red light, the second light-emitting unit 120 emits green light, and the third light-emitting unit 130 emits blue light.

In the present embodiment, for distinction, the colour resist units include a first colour resistance unit 310, a second colour resistance unit 320, and a third colour resistance unit 330. Light that is allowed to pass through the first colour resistance unit 310 is red. Light that is allowed to pass through the second colour resistance unit 320 is green. Light that is allowed to pass through the third colour resistance unit 330 is blue. In the present embodiment, the first colour resist unit 310 is configured to cover the first light-emitting unit 110, the colour of the light that is allowed to pass through the first colour resistance unit 310 is the same as the colour of the light emitted from the first light-emitting unit 110, such that the light emitted from the first light-emitting unit 110 is emitted to an outside of the device by passing through the first colour resist unit 310. Only red light of external ambient light can pass the first colour resist unit 310, and the other light of the external ambient light in a colour other than the red is filtered out. The second colour resist unit 320 is configured to cover the second light-emitting unit 120, the colour of the light that is allowed to pass through the second colour resistance unit 320 is the same as the colour of the light emitted from the second light-emitting unit 120, such that the light emitted from the second light-emitting unit 120 is emitted to the outside of the device by passing through the second colour resist unit 320. Only green light of external ambient light can pass the second colour resist unit 320, and the other light of the external ambient light in a colour other than the green is filtered out. The third colour resist unit 330 is configured to cover the third light-emitting unit 130, the colour of the light that is allowed to pass through the third colour resistance unit 330 is the same as the colour of the light emitted from the third light-emitting unit 130, such that the light emitted from the third light-emitting unit 130 is emitted to the outside of the device by passing through the third colour resist unit 330. Only blue light of external ambient light can pass the third colour resist unit 330, and the other light of the external ambient light in a colour other than the blue is filtered out.

In the present embodiment, the colours of the lights that are allowed to pass through the first colour resist unit 310, the second colour resist unit 320, and the third colour resist unit 330 are the same as the colours of the lights emitted from the first light emitting unit 110, the second light emitting unit 120, and the third light emitting unit 130, respectively. In this way, when the color resist units cover the three light-emitting units of the light-emitting display layer 100, transmittance of the lights emitted by the three light-emitting units may not be affected or weakened, such that light loss is reduced, and displaying brightness of the OLED display panel is improved. In addition, the color resist units may reduce reflection of external ambient light.

In the present embodiment, the color resist layer 300 is made of liquid crystal material. Specifically, in the present embodiment, the colour resist layer 300 is made of a quarter phase-difference liquid crystal material. The liquid crystal material in the present embodiment is an inorganic material. For example, in the present embodiment, the first colour resist unit 310 is made of a liquid crystal material having a quarter phase difference of the light emitted by the first light-emitting unit 110. The second colour resist unit 320 is made of a liquid crystal material having a quarter phase difference of the light emitted by the second light-emitting unit 120. The third colour resist unit 330 is made of a liquid crystal material having a quarter phase difference of the light emitted by the third light-emitting unit 130.

In the present embodiment, the light-emitting display layer 100 is disposed on an array substrate 420. The touch display panel further includes a pixel defining layer 410. The pixel defining layer 410 includes bank structures (not shown in the drawings) and an opening (not shown in the drawings) defined between two adjacent bank structures. The light-emitting units are located in the opening of the pixel defining layer 410.

In the present embodiment, the first touch electrode 210 and the color resist layer 300 are located on the same layer. The first touch electrode 210, the second touch electrode 220, and the color resist layer 300 cooperatively form a touch and color resist composite layer. The touch and color resist composite layer are adhered to a top of the light-emitting display layer 100 by an adhesive. In the present embodiment, an adhesive layer may be omitted, and a thickness of the touch and color resist composite layer is less than a thickness of a superimposed layer formed by a touch layer and a polarizer layer. The thickness of the touch display panel can be reduced.

In the present embodiment, the touch display panel further includes an encapsulation layer 500. The encapsulation layer 500 is disposed between the light-emitting display layer 100 and the first touch electrode 210. In the present embodiment, the encapsulation layer 500 encapsulates the light-emitting display layer 100. In the present embodiment, the encapsulation layer 500 is a thin film encapsulation layer. The encapsulation layer 500 includes an inorganic thin film encapsulation layer, an organic thin film encapsulation layer, and another inorganic thin film encapsulation layer, the inorganic thin film encapsulation layer, the organic thin film encapsulation layer, and the another inorganic thin film encapsulation layer are laminated. In other embodiments, the encapsulation layer 500 may alternatively be a rigid encapsulation layer and include a glass encapsulation layer 500. In the present embodiment, the first touch electrode 210 is located out of the encapsulation layer 500, such that the first touch electrode 210, the second touch electrode 220, and the colour resist layer 300 are located out of the encapsulation layer 500.

In an embodiment, the touch and colour resist composite layer in the above embodiment may be adhered to a side of the encapsulation layer 500 away from the light-emitting display layer 100 by an adhesive.

In another embodiment, the first touch electrode 210 and the colour resist layer 300 are disposed directly on the encapsulation layer 500. By arranging the first touch electrode 210 and colour resist layer 300 directly on the encapsulation layer 500, the first touch electrode 210 and colour resist layer 300 are formed directly on the encapsulation layer 500. No adhere is disposed to adhere the first touch electrode 210 and colour resist layer 300 to the encapsulation layer 500. In this way, a distance from the first touch electrode 210 and colour resist layer 300 to the light-emitting display layer 100 is reduced. Further, the medium disposed between the first touch electrode 210 and colour resist layer 300 and the light-emitting display layer 100 is less, such that interference, caused by the medium, on the light emitted from the light-emitting display layer 100 is reduced, and the light-emitting efficiency is improved. In the present embodiment, the first touch electrode 210 is formed directly above the encapsulation layer 500 by physical vapor deposition. The colour resist layer 300 is formed directly on the encapsulation layer 500 by developing or baking. In this way, the first touch electrode 210 and the colour resist layer 300 are firmly bonded to the encapsulation layer 500, the adhesive layer disposed between the first touch electrode 210 and the encapsulation layer 500 (not shown in the drawings) may be reduced. Further, the adhesive layer configured to adhere the polarizer to the touch layer formed by the first touch electrode 210 and the second touch electrode 220 may be reduced. In this way, two adhesive layers may be omitted from the touch display panel of the present disclosure.

In the present embodiment, the first touch electrode 210 is Ti/Al/Ti. In the present embodiment, thicknesses of the Ti/Al/Ti is 0.05/0.2/0.05 μm respectively. In this way, in the present embodiment, the thickness of the first touch electrode 210 is 0.3 μm, and the thickness of the colour resist layer 300 is 1.75μ. In other embodiments, the first touch electrode 210 may be made of other materials. For example, the first touch electrode 210 may be made of Ag nanowires, and so on. The thickness of the first touch electrode 210 may be determined as desired. The thickness of the colour resist layer 300 may be determined as desired.

In the present embodiment, the touch display panel further includes a first buffer layer 710. The first buffer layer 710 is located between the encapsulation layer 500 and the first touch electrode 210. The first touch electrode 210 and colour resist layer 300 are directly arranged on the first buffer layer 710. In the present embodiment, the first buffer layer 710 is an inorganic layer and is configured to buffer an impact, caused by the first touch electrode 210 being formed on the encapsulation layer 500, applied to the encapsulation layer 500. In addition, the first buffer layer 710 enables the first touch electrode 210 to be combined with the encapsulation layer 500 more tightly and firmly. Specifically, in the present embodiment, the first buffer layer 710 is made of SiON. In the present embodiment, the SiON of the first buffer layer 710 has a Si—O bond. A Ti—O bond may be easily formed from the Si—O bond and Ti, enabling a bonding force between the first touch electrode 210 and the first buffer layer 710 to be larger. In this way, the bonding effect between the first touch electrode 210 and the first buffer layer 710 is increased, and a probability of the first touch electrode 210 being separated from the encapsulation layer 500 is reduced. In the above embodiment, when the encapsulation layer 500 is made of the inorganic thin film encapsulation layer and the organic thin film encapsulation layer, an outermost side of the encapsulation layer 500 is the inorganic thin film encapsulation layer. When the inorganic thin film encapsulation layer is the SiON, the first buffer layer 710 may not be arranged. When the inorganic thin film encapsulation layer is the SiN, the SiON of the first buffer layer 710 may be tightly bonded with both the SiN of the inorganic thin film encapsulation layer and the Ti/Al/Ti of the first touch electrode 210. In the present embodiment, the first buffer layer 710 may be made of other inorganic materials. For example, the first buffer layer 710 may a metal oxide inorganic layer.

In the present embodiment, the touch display panel further includes a black matrix layer 600. The black matrix layer 600 is embedded in at least one gap defined in the colour resist layer 300 and covers the first touch electrode 210. In the present embodiment, since the black matrix layer 600 is embedded in the gap defined in the colour resist layer 300, the light, which is emitted from the light-emitting units in the light emitting display layer 100, may be prevented by black matrix layer 600 from being emitted through the gap in the colour resist layer 300. In this way, mutual colour cross-combination between lights emitted from different light-emitting units in the light-emitting display layer 100 is reduced.

Specifically, in the present embodiment, the black matrix layer 600 covers the first touch electrode 210, such that the black matrix layer 600 serves as an insulating layer between the first touch electrode 210 and the second touch electrode 220. In an aspect, short circuits between the first touch electrode 210 and the second touch electrode 220 may be prevented. In another aspect, since the black matrix layer 600 covers the first touch electrode 210, external ambient light may be prevented from reaching the first touch electrode 210, such that the first touch electrode 210 may not reflect the external ambient light, and the light emitted from the touch display panel may not be affected by the external ambient light. In still another aspect, the black matrix layer 600 may be better adhered to the first touch electrode 210, and the black matrix layer 600 covers the first touch electrode 210, such that the first touch electrode 210 directly contacts the encapsulation layer 500 or the first buffer layer 710. Therefore, the first touch electrode 210 is firmly bonded with the encapsulation layer 500 or the first buffer layer 710, facilitating the touch display panel to be bent or folded, and the touch display panel may be deformed easily. In other embodiments, the first touch electrode 210 may cover the black matrix layer 600, such that the light, which is emitted from the light-emitting units in the light emitting display layer 100, may be prevented by black matrix layer 600 from being emitted through the gap in the colour resist layer 300, and mutual colour cross-combination between lights emitted from different light-emitting units in the light-emitting display layer 100 is reduced.

In the present embodiment, the touch display panel includes a second buffer layer 720. The second buffer layer 720 is disposed between the first touch electrode 210 and the second touch electrode 220. The second buffer layer 720 covers the first touch electrode 210 and the colour resist layer 300. In the present embodiment, the second buffer layer 720 is an inorganic layer. By arranging the second buffer layer 720, the second touch electrode 220 may be easily manufactured on the second buffer layer 720, enabling the second touch electrode 220 to be easily deposited on the inorganic layer by physical vapor deposition. In this way, the second touch electrode 220 is tightly bonded with the second buffer layer 720. Further, the second buffer layer 720 is easily bonded with the colour resist layer 300. In another aspect, the second buffer layer 720 may serve as a planarization layer to planarize a layer where the colour resist layer 300 is located, such that the second touch electrode 220 is formed on a surface of the flat second buffer layer 720. In this way, the first touch electrode 210 and the second touch electrode 220 may achieve the touch effect uniformly.

In an embodiment, a layer in which the first touch electrode 210 is located is parallel to a layer in which the second touch electrode 220 is located. The first touch electrode 210 and the second touch electrode 220 are insulated from the black matrix layer 600 through the second buffer layer 720.

Figure 3:
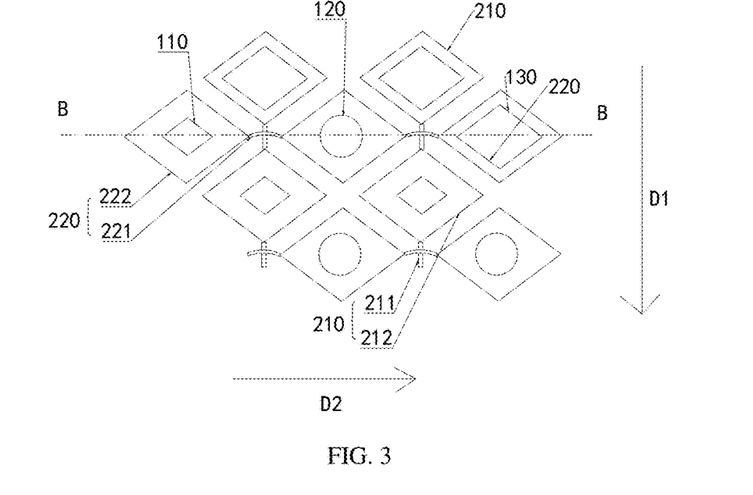
FIG. 3 is a planar structural schematic view of a touch display panel according to another embodiment of the present disclosure.

In the present embodiment, each of the first touch electrode 210 and the second touch electrode 220 is a linear touch electrode (not labeled in the drawings). A plurality of first touch electrodes 210 are arranged. The first touch electrode 210 is arranged along the first direction D1, and the plurality of first touch electrodes 210 are distributed along the second direction D2. A plurality of second touch electrodes 220 are arranged. The second touch electrode 220 is arranged along the second direction D2, and the plurality of second touch electrodes 220 are distributed along the first direction D1. In other embodiments, as shown in FIG. 3, each of the first touch electrode 210 and the second touch electrode 220 includes rhombus-shaped grid touch electrodes (not shown) and at least one linear touch electrode. The at least one linear touch electrode is connected with adjacent two grid touch electrodes, such that the adjacent grid touch electrodes are spaced apart from each other. For distinction, the rhombus-shaped grid touch electrodes included in the first touch electrode 210 are first grid touch electrodes 212, and the linear touch electrode included in the first touch electrode 210 is a first linear touch electrode 211. The rhombus-shaped grid touch electrodes included in the second touch electrode 220 are second grid touch electrodes 222, and the linear touch electrode included in the second touch electrode 220 is a second linear touch electrode 221. In the present embodiment, "the first touch electrode 210 is arranged along the first direction D1" refers to an overall extension direction of the first touch electrode 210 is along the first direction D1; and "the second touch electrode 220 is arranged along the second direction D2" refers to an overall extension direction of the second touch electrode 220 is along the second direction D2.

In the present embodiment, as shown in FIG. 1 and FIG. 2, the first touch electrode 210 and the second touch electrode 220 directly faces at least one gap defined by the light-emitting units arranged in the array, enabling the first touch electrode 210 and the second touch electrode 220 to be disposed to directly face the bank structure formed by the pixel defining layer 410. In this way, the first touch electrode 210 and the second touch electrode 220 may not block the light-emitting units. Therefore, the first touch electrode 210 and the second touch electrode 220 may not affect the light-emitting effect of the light-emitting units of the touch display panel.

In the present embodiment, the touch display panel further includes a first planarization layer 810 and a cover 900.

The first planarization layer 810 is arranged on a side of the second touch electrode 220 facing towards the light-emitting surface of the touch display panel. The cover 900 is adhered to the first planarization layer 810 by an adhesive layer (not shown in the drawings). In the present embodiment, the first planarization layer 810 is an organic layer. By arranging the first planarization layer 810, the first planarization layer 810 planarizes the layer where the second touch electrode 220 is located, such that the cover 900 is adhered to the first planarization layer 810 through the adhesive layer (not shown in the drawings). In the present embodiment, when the light emitted from the light-emitting unit is finally emitted out of the device through the cover 900, the number of adhesive layers passed by the light is reduced, influence, caused by the adhesive layer, on the light emitting effect is reduced, and the light emitting efficiency is improved.

In the present embodiment, a second planarization layer 820 may further be included. The second planarization layer 820 is disposed between the colour resist layer 300 and the second buffer layer 720. In the present embodiment, by arranging the second planarization layer 820, the layer where the colour resist layer 300 is located may be planarized, enabling the second buffer layer 720 to be flat. In the present embodiment, the second planarization layer 820 is an organic layer and may be made by spin coating, spraying, or deposition.

Figure 4:
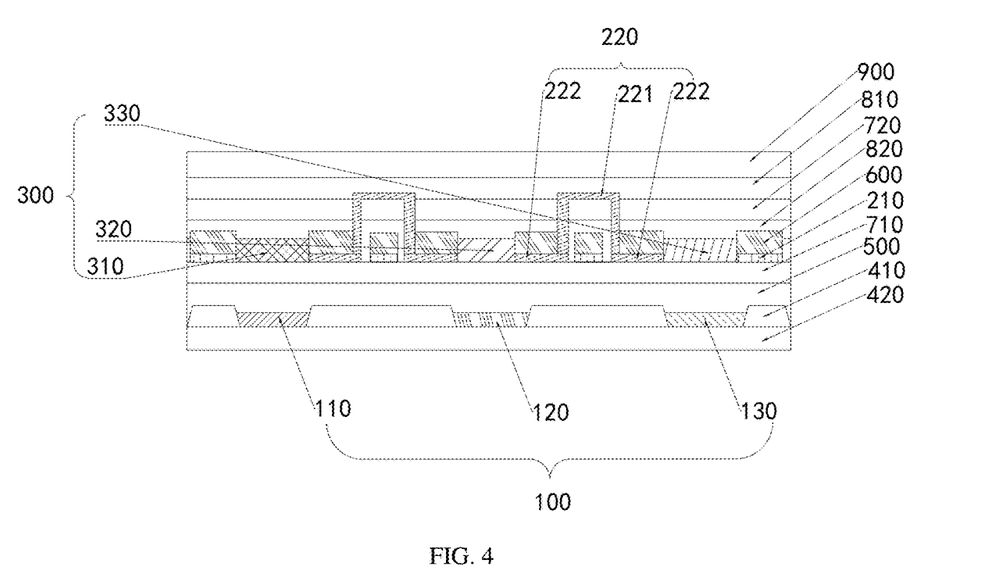
FIG. 4 is a cross-sectional schematic view of the structure shown in FIG. 1, taken along the line B-B.

In another embodiment, as shown in FIG. 3 and FIG. 4, at least a part of the first touch electrode 210 and at least a part of the second touch electrode 220 are located on the same layer. The first touch electrode 210 does not directly contact the second touch electrode 220 at a location where the first touch electrode 210 intersects with the second touch electrode 220. For example, as described in the above, the first touch electrode 210 is arranged along the first direction D1, and the second touch electrode 220 is arranged along the second direction D2. The first direction D1 intersects with the second direction D2 at an intersection, and the first touch electrode 210 does not directly contact the second touch electrode 220 at the intersection. The first touch electrode 210 is insulated from the second touch electrode 220 at one or more overlap between the first touch electrode 210 and the second touch electrode 220. Specifically, in the present embodiment, the first touch electrode 210 and a part of the second touch electrode 220 are located on the same layer, and another part of the second touch electrode 220 forms a bridge (not labeled in the drawings) to connect the entire second touch electrode 220. The other part of the second touch electrode 220 is insulated from the first touch electrode 210. For example, the other part of the second touch electrode 220 is insulated from the first touch electrode 210 by the black matrix layer 600 and the first buffer layer 710. In the present embodiment, the first touch electrode 210, a part of the second touch electrode 220, and the colour resist layer 300 are located side by side and are disposed on the same layer. In another embodiment, a part of the first touch electrode 210 and the entire second touch electrode 220 are located on the same layer, and another part of the first touch electrode 210 forms a bridge to connect the entire first touch electrode 210. In this embodiment, the part of the first touch electrode 210, the second touch electrode 220, and the colour resist layer 300 are arranged side by side and are disposed on the same layer.

In the present embodiment, as shown in FIG. 3 and FIG. 4—, each of the first touch electrode 210 and the second touch electrode 220 includes the rhombus-shaped grid touch electrodes and at least one linear touch electrode, and each at least one linear touch electrode is connected between an adjacent two grid touch electrodes. In the present embodiment, the first linear touch electrode 211 and the first grid touch electrodes 212 of the first touch electrode 210 and the second grid touch electrodes 222 of the second touch electrode 220 are arranged on the same layer. The second grid touch electrode 222 of the second touch electrode 220 is disconnected from the first touch electrode 210 at an intersection between the second grid touch electrode 222 and the first touch electrode 210. For example, an extending direction of the second grid touch electrode 222 intersects with an extending direction of the first touch electrode 210, and the second grid touch electrode 222 is disconnected from the first touch electrode 210 at the intersection. In the present embodiment, the second linear touch electrode 221 forms the bridge, and adjacent second grid touch electrodes 222 are connected with each other through the second linear touch electrode 221. In this way, the adjacent second grid touch electrodes 222 of the second touch electrode 220 are connected with each other through the second linear touch electrode 221.

In the present embodiment, the first touch electrode 210 and the second touch electrode 220 directly faces the at least one gap defined by the light-emitting units arranged in the array (not shown in the drawings), enabling the first touch electrode 210 and the second touch electrode 220 to be disposed to directly face the bank structure formed by the pixel defining layer 410. In this way, the first touch electrode 210 and the second touch electrode 220 may not block the light-emitting units. Therefore, the first touch electrode 210 and the second touch electrode 220 may not affect the light-emitting effect of the light-emitting units of the touch display panel. Specifically, in the present embodiment, the grid touch electrodes are arranged to surround the light-emitting units, such that the grid touch electrodes do not affect the light-emitting effect of the light-emitting units.

In the present embodiment, the touch display panel further includes the first planarization layer 810 and the cover 900. The first planarization layer 810 is arranged on a side of the second touch electrode 220 facing towards the light-emitting surface of the touch display panel. The cover 900 is adhered to the first planarization layer 810 by the adhesive layer (not shown in the drawings). In the present embodiment, the first planarization layer 810 is an organic layer. By arranging the first planarization layer 810, the first planarization layer 810 planarize the layer where the second touch electrode 220 is located, such that the cover 900 is adhered to the first planarization layer 810 through the adhesive layer. Therefore, in the present embodiment, when the light emitted from the light-emitting unit is finally emitted to the outside of the device through the cover 900, the number of adhesive layers passed by the light is reduced, influence, caused by the adhesive layer, on the light emitting effect is reduced, and the light emitting efficiency is improved.

In the present embodiment, a second planarization layer 820 may further be included. The second planarization layer 820 is disposed between the colour resist layer 300 and the second buffer layer 720. In the present embodiment, the second planarization layer 820 is arranged to planarize the layer where the colour resist layer 300 is located. In this way, the second buffer layer 720 is flatter. In the present embodiment, the second planarization layer 820 is an organic layer and may be made by spin coating, spraying, or deposition.

The present disclosure further provides a method of manufacturing the touch display panel as described in the above embodiments.

Figure 5A:
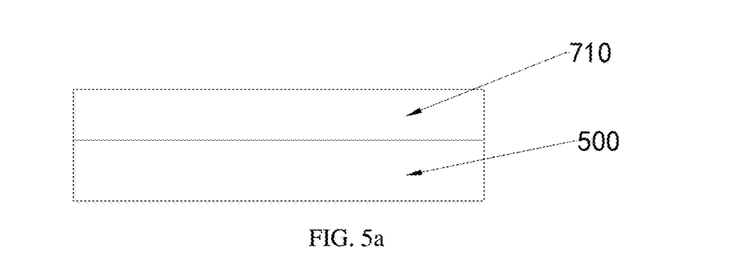
FIG. 5a is a schematic view of the touch display panel made by performing an operation S100 of a manufacturing process according to an embodiment of the present disclosure.

In an operation S100, as shown in FIG. 5a, the first buffer layer 710 is made on a light emitting side of the encapsulation layer 500. In the present embodiment, the first buffer layer 710 is made by chemical vapour deposition. In the present embodiment, the thickness of the first buffer layer 710 is 1 µm. In other embodiments, the thickness of the first buffer layer 710 may be other values, or the first buffer layer 710 may be omitted.

Figure 5B:
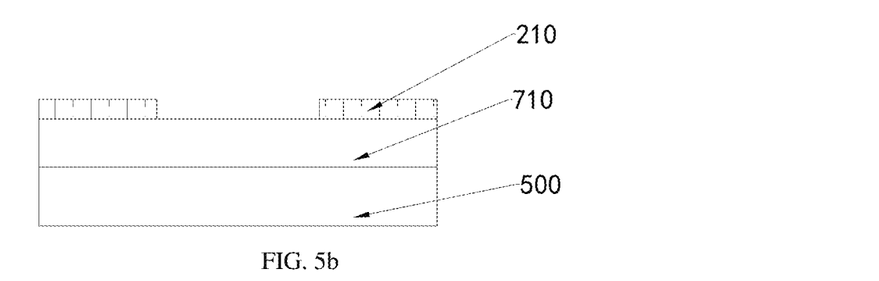
FIG. 5b is a schematic view of the touch display panel made by performing an operation S200 of a manufacturing process according to an embodiment of the present disclosure.

In an operation S200, as shown in FIG. 5b, the first touch electrode 210 is made on the side of the first buffer layer 710 facing the light emitting surface, such that the first touch electrode 210 is arranged along the first direction D1 parallel to the touch display panel. In the present embodiment, the first touch electrode 210 is made by physical vapour deposition, followed by a patterning process, such that the first touch electrode 210 is formed. In the present embodiment, the first touch electrode 210 faces towards the gap between adjacent light-emitting units of the light emitting display layer 100. That is, the first touch electrode 210 faces towards the bank structure formed by the pixel definition layer 410. The first touch electrode 210 in the present embodiment includes Ti/Al/Ti, and the thickness of the first touch electrode 210 is 0.3 µm.

Figure 5C:
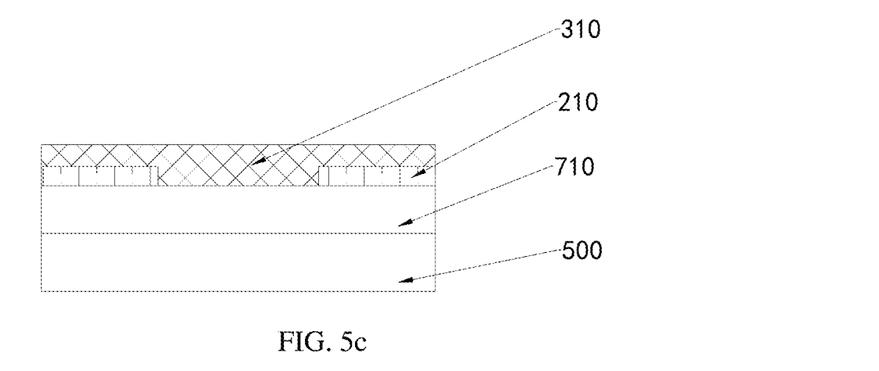
FIG. 5c is a schematic view of the touch display panel made by performing an operation S300 of a manufacturing process according to an embodiment of the present disclosure.

In an operation S300, as shown in FIG. 5c, the colour resist layer 300 is made on the first touch electrode 210 and a part of the first buffer layer 710 (as shown in FIG. 2), such that the colour resist layer 300 covers the light-emitting units of the light-emitting display layer 100.

In FIG. 5c, only the first colour resist unit 310 of the colour resist layer 300 is shown. In the present embodiment, a developing or baking process may be performed on the colour resist layer 300 to form a patterned colour resist layer 300. In the present embodiment, the colour resist layer 300 includes the colour resist unit 310, the second colour resist unit 320, and the third colour resist unit 330. In the present embodiment, by manufacturing the first colour resist unit 310, the second colour resist unit 320, and the third colour resist unit 330 successively, the first colour resist unit 310 covers the first light-emitting unit 110, the second colour resist unit 320 covers the second light-emitting unit 120, and the third colour resist unit 330 covers the third light-emitting unit 130. In the present embodiment, the thickness of the colour resist layer 300 is 1.75 µm. In the present embodiment, the thickness of the colour resist layer 300 is only an example, and in other embodiments, the thickness of the colour resist layer 300 may also be in other values.

Figure 5D:
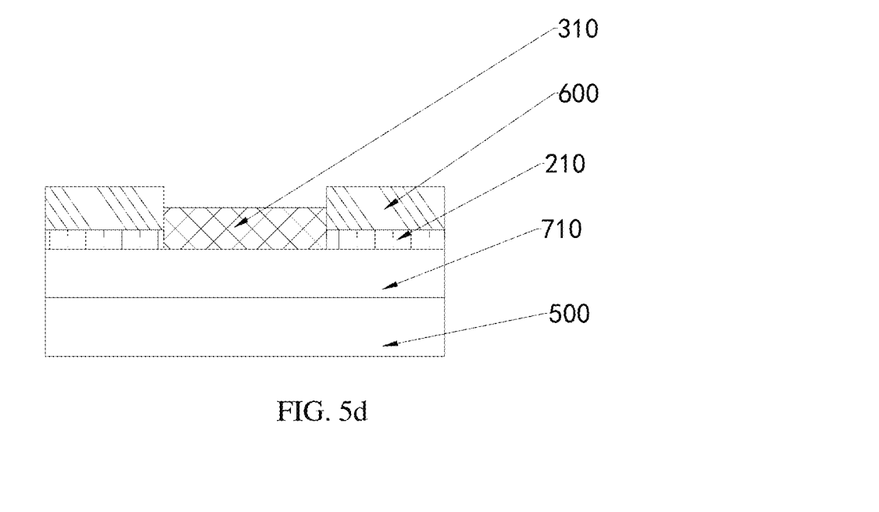
FIG. 5d is a schematic view of the touch display panel made by performing an operation S400 of a manufacturing process according to an embodiment of the present disclosure.

In an operation S400, as shown in FIG. 5d, the black matrix layer 600 is made, such that the black matrix layer 600 is embedded in the gap formed between adjacent colour resist units of the colour resist layer 300, and the black matrix layer 600 covers the first touch electrode 210.

In the present embodiment, the black matrix layer 600 includes acrylic resin and a black pigment. In other embodiments, the black matrix layer 600 may alternatively include chromium and the black pigment. In the present embodiment, the black matrix layer 600 is masked by a mask plate and is manufactured by chemical vapour deposition. In the present embodiment, the black matrix layer 600 is embedded in the gap formed between adjacent colour resist units of the colour resist layer 300, and that is, the black matrix layer 600 is disposed on the bank structure formed by the pixel defining layer 410. In the present embodiment, the thickness of the black matrix layer 600 is 1.15 µm. In the present embodiment, the thickness of the black matrix layer 600 is only an example, and in other embodiments, the thickness of the black matrix layer 600 may be in other values.

Figure 5E:
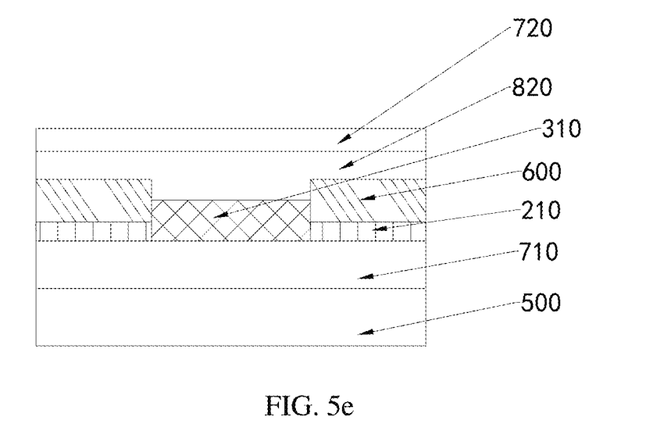
FIG. 5e is a schematic view of the touch display panel made by performing an operation S500 of a manufacturing process according to an embodiment of the present disclosure.

In an operation S500, as shown in FIG. 5e, the second planarization layer 820 and a second buffer layer 720 are manufactured successively on the black matrix layer 600 and the colour resist layer 300.

In the present embodiment, the second planarization layer 820 is an organic layer, and the first buffer layer 710 is an inorganic layer. Specifically, the second buffer layer 720 is a SiON layer. In the present embodiment, the second planarization layer 820 and the second buffer layer 720 are manufactured successively by vapor deposition. In the present embodiment, the thickness of the second planarization layer 820 is 0.1 µm, and the thickness of the second buffer layer 720 is 0.2 µm. In the present embodiment, the thicknesses of the second planarization layer 820 and the second buffer layer 720 are only examples, and in other embodiments, the thicknesses of the second planarization layer 820 and the second buffer layer 720 may be in other values. In other embodiments, the second planarization layer 820 may be omitted.

Figure 5F:
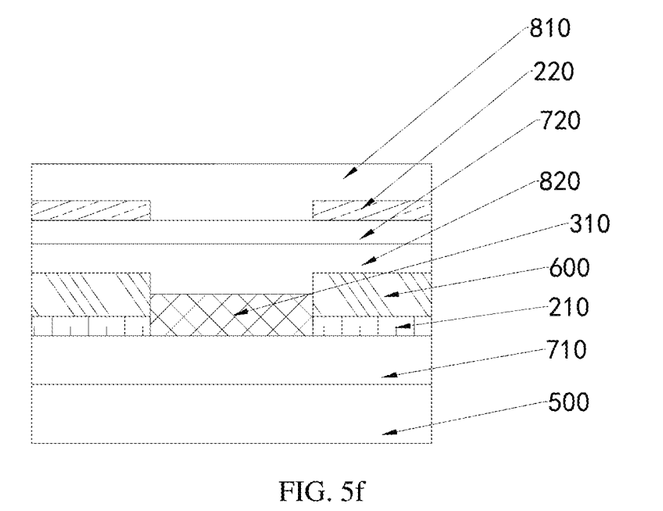
FIG. 5f is a schematic view of the touch display panel made by performing an operation S600 of a manufacturing process according to an embodiment of the present disclosure.

In an operation S600, as shown in FIG. 5f, the second touch electrode 220 is manufactured on a side of the second planarization layer 820. The second touch electrode 220 is arranged along the second direction D2 parallel to the touch display panel. The first direction D1 intersects with the second direction D2, for instance, at an intersection. The first touch electrode 210 is insulated from the second touch electrode 220 at the at least one overlap between the first touch electrode 210 and the second touch electrode 220. That is, the first touch electrode 210 is insulated from the second touch electrode 220 at the intersection.

In the present embodiment, the second touch electrode 220 is made by physical vapour deposition. In the present embodiment, the second touch electrode 220 is Ti/Al/Ti, and the thicknesses of the Ti/Al/Ti are 0.05/0.2/0.05 µm. That is, the thickness of the second touch electrode 220 is 0.3 µm.

Figure 5G:
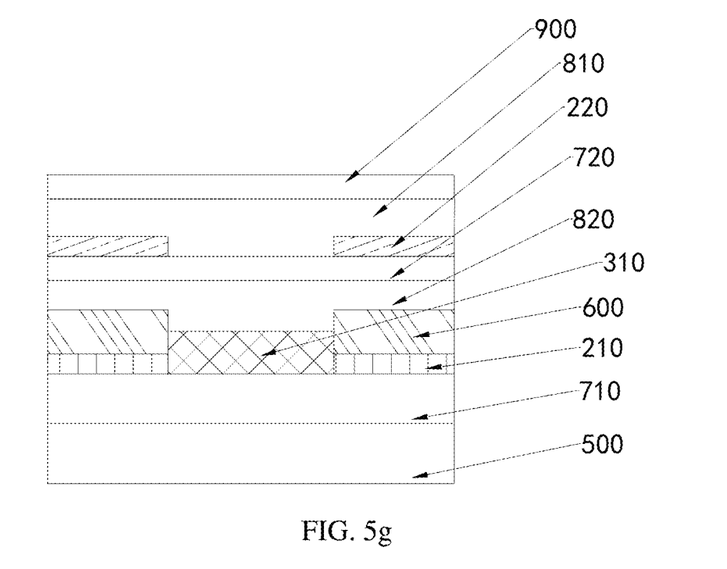
FIG. 5g is a schematic view of the touch display panel made by performing an operation S700 of a manufacturing process according to an embodiment of the present disclosure.

In the present embodiment, as shown in FIG. 5f, the first planarization layer 810 is manufactured on the second touch electrode 220, and as shown in FIG. 5g, the cover 900 is adhered to the first planarization layer 810 by the adhesive.

In the present embodiment, the first planarization layer 810 is an organic layer and is deposited, by vapour deposition, on the second touch electrode 220 and a part of the second buffer layer 720. In the present embodiment, the first planarization layer 810 is made of polymethyl methacrylate, and the thickness of the first planarization layer 810 is 6 µm. In the present embodiment, the thickness of the first planarization layer 810 is only an example, and in other embodiments, the thickness of the first planarization layer 810 may be in other values. In the present embodiment, the cover 900 is a glass cover 900, and the glass cover 900 is adhered to the first planarization layer 810 by the adhesive.

In another embodiment, the method of manufacturing the touch display panel includes the following operations.

In an operation S100, the first buffer layer 710 is made on a light emitting side of the encapsulation layer 500.

The first buffer layer 710 in the present embodiment is the same as that in the above embodiment. Alternatively, the first buffer layer 710 may be omitted.

Figure 6A:
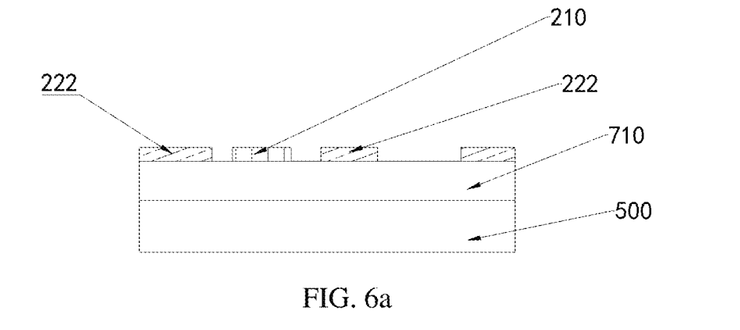
FIG. 6a is a schematic view of the touch display panel made by performing an operation S200 of another manufacturing process according to an embodiment of the present disclosure.

In an operation S200, as shown in FIG. 6a, the first touch electrode 210 and a part of the second touch electrode 220 are made on the side of the first buffer layer 710 facing towards the light emitting surface, such that the first touch electrode 210 is arranged along the first direction D1 parallel to the touch display panel. The part of the second touch electrode 220 is disconnected from the first touch electrode 210 at the intersection between the second touch electrode 220 and the first touch electrode 210. In this way, the second touch electrode does not directly contact the first touch electrode 210, and the part of the second touch electrode 220 is arranged along the second direction D2 parallel to the touch display panel.

In the present embodiment, the first touch electrode 210 and the part of the second touch electrode 220 are made by physical vapour deposition, and subsequently a patterning process is performed, such that the first touch electrode 210 and the part of the second touch electrode 220 are formed. In the present embodiment, the first touch electrode 210 and the part of the second touch electrode 220 directly face the gap defined by the light-emitting units of the light-emitting display layer 100. That is, the first touch electrode 210 and the part of the second touch electrode 220 directly face the bank structure formed by the pixel defining layer 410. Each of the first touch electrode 210 and the part of the second touch electrode 220 in the present embodiment includes the Ti/Al/Ti, and the thickness of each of the first touch electrode 210 and the part of the second touch electrode 220 is 0.3 μm.

In the present embodiment, the first touch electrode 210 includes a first linear touch electrode 211 and a first grid touch electrode 212. The part of the second touch electrode 220 includes a second grid touch electrode 222. In other embodiments, each of the first touch electrode 210 and the part of the second touch electrode 220 may be only the linear touch electrode.

Figure 6B:
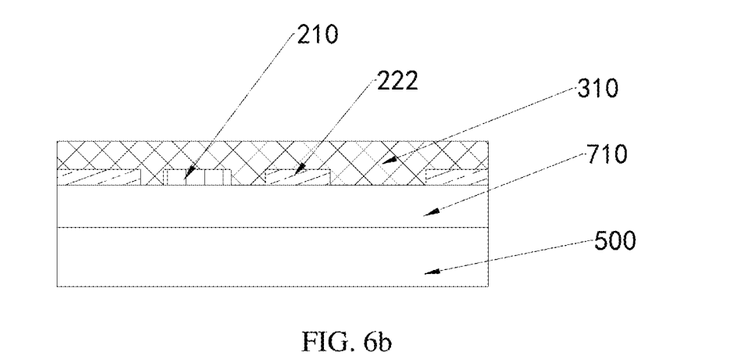
FIG. 6b is a schematic view of the touch display panel made by performing an operation S300 of another manufacturing process according to an embodiment of the present disclosure.
Figure 6C:
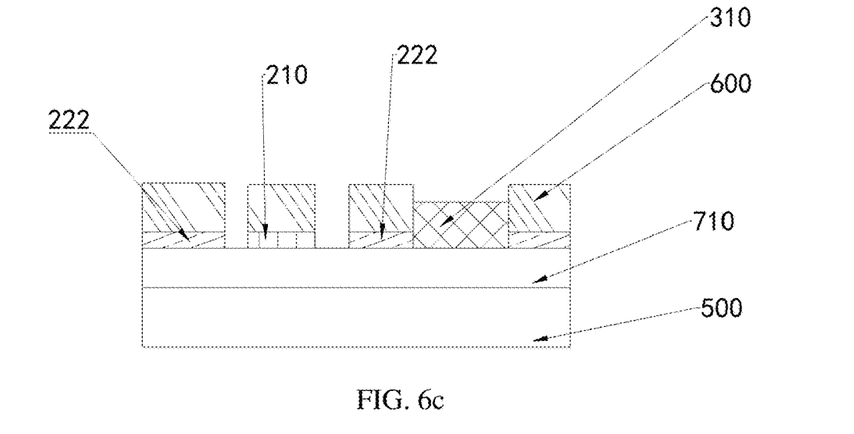
FIG. 6c is a schematic view of the touch display panel made by performing an operation S400 of another manufacturing process according to an embodiment of the present disclosure.

In an operation S300, as shown in FIG. 6b and FIG. 6c, the colour resist layer 300 is made on the first buffer layer 710, such that the colour resist layer 300 covers the light-emitting units of the light-emitting display layer 100.

In the present embodiment, the developing or the baking process is performed to form the patterned colour resist layer 300. In the present embodiment, the colour resist layer 300 includes colour resist units. Specifically, in the present embodiment, the colour resist units include the first colour resist unit 310, the second colour resist unit 320, and the third colour resist unit 330. In the present embodiment, by manufacturing the first colour resist unit 310, the second colour resist unit 320, and the third colour resist unit 330 successively, the first colour resist unit 310 covers the first light-emitting unit 110, the second colour resist unit 320 covers the second light-emitting unit 120, and the third colour resist unit 330 covers the third light-emitting unit 130. In the present embodiment, the thickness of the colour resist layer 300 is 1.75 μm. In the present embodiment, the thickness of the colour resist layer 300 is only an example, and in other embodiments, the thickness of the colour resist layer 300 may be in other values.

In an operation S400, as shown in FIG. 6c, the black matrix layer 600 is manufacture, such that the black matrix layer 600 is embedded in the gap defined between adjacent colour resist units of the colour resist layer 300, and the black matrix layer 600 covers the first touch electrode 210 and the part of the second touch electrode 220.

In the present embodiment, the black matrix layer 600 includes acrylic resin and the black pigment. In other embodiments, the black matrix layer 600 may alternatively include chromium and the black pigment. In the present embodiment, the black matrix layer 600 is masked by a mask plate and made by chemical vapour deposition. In the present embodiment, the black matrix layer 600 is embedded in the gap defined between adjacent colour resist units of the colour resist layer 300. That is, the black matrix layer 600 is located on the bank structure formed by the pixel defining layer 410. In the present embodiment, the thickness of the black matrix layer 600 is 1.15 μm. In the present embodiment, the thickness of the black matrix layer 600 is only an example, and in other embodiments, the thickness of the black matrix layer 600 may be in other values.

Figure 6D:
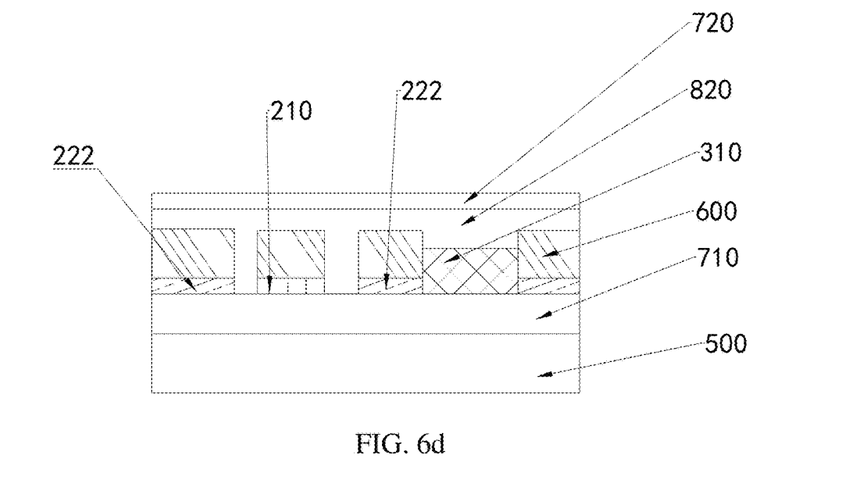
FIG. 6d is a schematic view of the touch display panel made by performing an operation S500 of another manufacturing process according to an embodiment of the present disclosure.

In an operation S500, as shown in FIG. 6d, the second planarization layer 820 and the second buffer layer 720 are manufactured successively on the black matrix layer 600 and the colour resist layer 300.

The present operation is the same as the operation in the above embodiment, and will not be repeated herein.

Figure 6E:
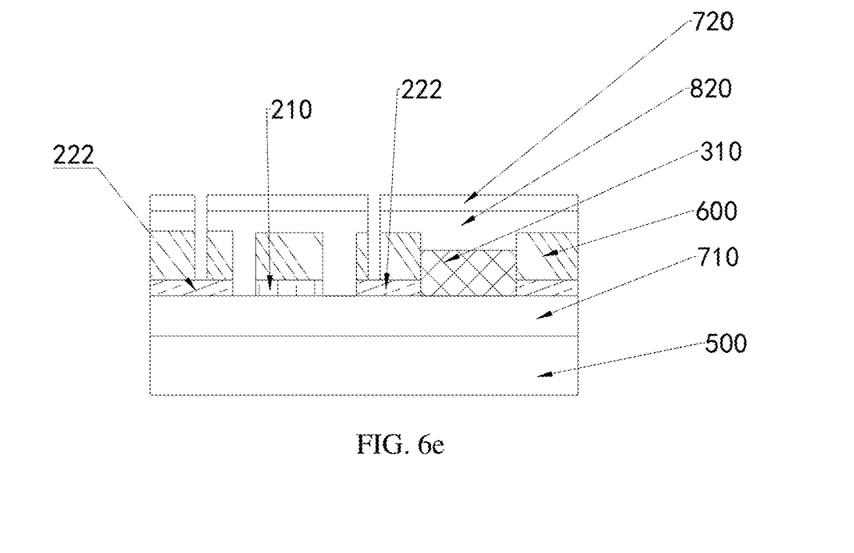
FIG. 6e is a schematic view of the touch display panel made by performing an operation S600 of another manufacturing process according to an embodiment of the present disclosure.
Figure 6F:
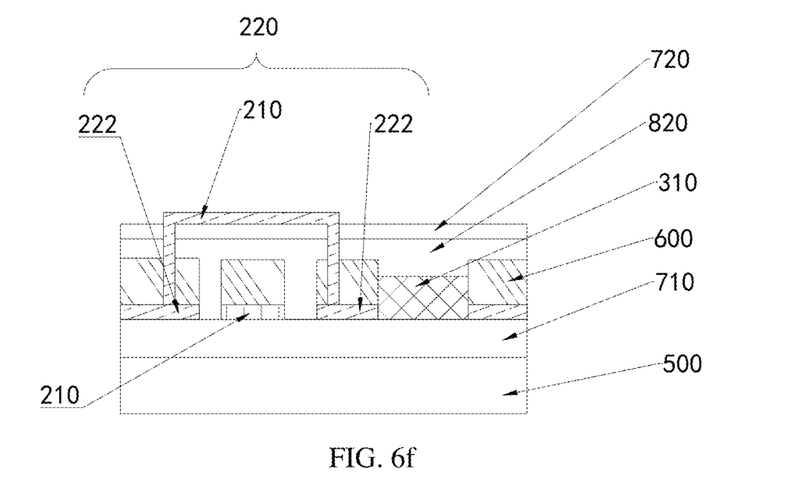
FIG. 6f is another schematic view of the touch display panel made by performing an operation S600 of another manufacturing process according to an embodiment of the present disclosure

In an operation S600, as shown in FIG. 6e, a through hole (not shown) is defined in the second planarization layer 820 and the second buffer layer 720, such that the through hole is connected to a part of the second touch electrode 220, and as shown in FIG. 6f, another part of the second touch electrode 220 is manufacture, enabling the second touch electrode 220 to fill the through hole and to be located above the second buffer layer 720. In this way, the another part of the second touch electrode is connected to the above-mentioned part of the second touch electrode 220, such that the entire second touch electrode is conducted.

In the present embodiment, the another part of the second touch electrode 220 is made by physical vapour deposition. In the present embodiment, the second touch electrode 220 is Ti/Al/Ti, and the thickness of the Ti/Al/Ti of the another part of the second touch electrode 220 located above the second buffer layer 720 is 0.05/0.2/0.05 μm.

In the present embodiment, a part of the second touch electrode 220 is the rhombus-shaped second grid touch electrode 222, and another part of the second touch electrode 220 is a second linear touch electrode 221.

Figure 6G:
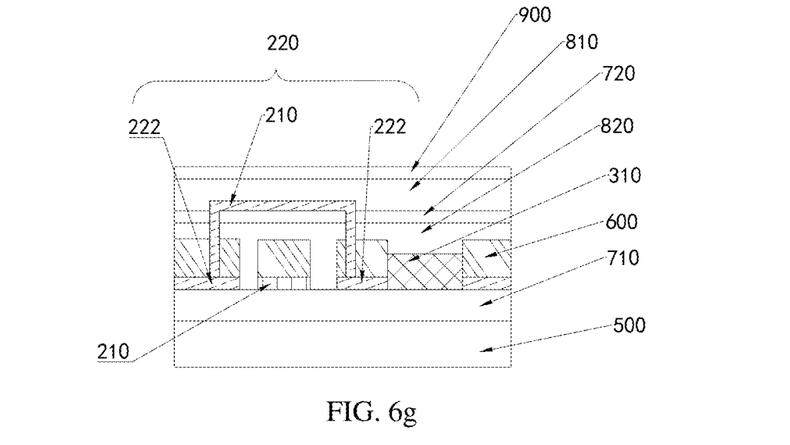
FIG. 6g is a schematic view of the touch display panel made by performing an operation S700 of another manufacturing process according to an embodiment of the present disclosure.

In an operation S700, as shown in FIG. 6g, the first planarization layer 810 is made on the second touch electrode 220, and the cover 900 is adhered to the first planarization layer 810 by the adhesive layer.

The present operation is the same as the operation in the above embodiment, and will not be repeated herein.

The above shows only an embodiment of the present disclosure and does not limit the scope of the present disclosure. Any equivalent structure or equivalent process transformation obtained based on the specification and the accompanying drawings of the present disclosure, applied directly or indirectly in other related fields, shall be equally covered by the present disclosure.

What is claimed is:

1. A touch display panel, comprising:
   a light-emitting display layer comprising a plurality of light-emitting units arranged in an array;
   a first touch electrode disposed on a side of the light-emitting display layer facing a light emitting surface of the touch display panel, wherein the first touch electrode is arranged along a first direction parallel to the touch display panel;
   a colour resist layer comprising a plurality of colour resist units arranged in an array, wherein the plurality of colour resist units are directly facing the plurality of light-emitting units;
   a second touch electrode disposed on the side of the light-emitting display layer facing the light-emitting surface of the touch display panel, wherein the second touch electrode is arranged along a second direction parallel to the touch display panel, the first direction intersects with and is different from the second direction, and the second touch electrode is insulated from the first touch electrode at an overlap between the second touch electrode and the first touch electrode, the second touch electrode comprises second grid touch electrodes and adjacent two of the second grid touch electrodes are connected by a bridge, the color resist layer and the second grid touch electrodes are overlapped by the orthographic projection in the horizontal direction; and a black matrix layer spaced from the bridge in the thickness direction of the display panel.

2. The touch display panel according to claim 1, further comprising an encapsulation layer disposed between the light-emitting display layer and the first touch electrode.

3. The touch display panel according to claim 2, wherein the first touch electrode and the colour resist layer are disposed on the encapsulation layer.

4. The touch display panel according to claim 2, wherein the first touch electrode, the second touch electrode, and the colour resist layer form a touch and colour-resist composite layer; and the touch and colour-resist composite layer are adhered, an adhesive, to a side of the encapsulation layer away from the light-emitting display layer.

5. The touch display panel according to claim 1, the black matrix layer embedded in at least one gap defined in the colour resist layer, and the black matrix layer covers the first touch electrode.

6. The touch display panel according to claim 1, further comprising a second buffer layer disposed between the first touch electrode and the second touch electrode, and the second buffer layer covers the first touch electrode and the colour resist layer.

7. The touch display panel according to claim 1, wherein the color resist layer and the first touch electrode are overlapped by a projection in the horizontal direction, at least part of the first touch electrode and at least part of the second touch electrode are disposed on a same layer, and the first touch electrode is insulated from the second touch electrode at the overlap between the first touch electrode and the second touch electrode.

8. The touch display panel according to claim 7, wherein the colour resist layer and the first touch electrode are arranged side by side, and the at least part of the first touch electrode, the at least part of the second touch electrode, and the colour resist layer are arranged side by side with each other and are disposed on a same layer.

9. The touch display panel according to claim 8, wherein the first touch electrode, the part of the second touch electrode, and the colour resist layer are arranged side by side with each other and are disposed on a same layer.

10. The touch display panel according to claim 8, wherein the part of the first touch electrode, the second touch electrode, and the colour resist layer are arranged side by side with each other and are disposed on a same layer.

11. The touch display panel according to claim 1, further comprising a first planarization layer and a cover, wherein the first planarization layer is arranged a side of the second touch electrode facing towards the light-emitting surface of the touch display panel, and the cover is adhered to the first planarization layer by an adhesive layer.

12. The touch display panel according to claim 11, further comprising a second planarization layer, wherein the second planarization layer is disposed between the colour resist layer and the second buffer layer.

13. The touch display panel according to claim 1, wherein each of the first touch electrode and the second touch electrode comprise rhombus-shaped grid touch electrodes and at least one linear touch electrode, wherein each of the at least one linear touch electrode is connected between adjacent two of the grid touch electrodes.

14. The touch display panel according to claim 13, wherein the second touch electrode comprises at least one second linear touch electrode, the first touch electrode and the second grid touch electrodes of the second touch electrode are disposed on the same layer, the second grid touch electrodes of the second touch electrode is disconnected from the first touch electrode at an intersection between the second grid touch electrodes and the first touch electrode, the second linear touch electrode forms the bridge.

15. The touch display panel according to claim 1, wherein the first touch electrode, the second touch electrode, and the colour resist layer form a touch and colour-resist composite layer; and the touch and colour-resist composite layer are disposed above and adhered, by an adhesive, to the light-emitting display layer.

16. The touch display panel according to claim 1, at least part of the bridge and the color resist layer are non-overlapped by a orthographic projection in the horizontal direction.

17. The touch display panel according to claim 1, the bridge comprises a part extending in the horizontal direction, the part and the colour resist layer are non-overlapped in the horizontal direction.

18. The touch display panel according to claim 1, in the thickness direction of the display panel, at least one insulating layer is disposed between the bridge and the black matrix layer.

19. The touch display panel according to claim 1, in the thickness direction of the display panel, at least two insulating layers are disposed between the bridge and the black matrix layer.

20. The touch display panel according to claim 1, the first touch electrode and the colour resist layer are in contact with the encapsulation layer.

* * * * *